US012658679B2

(12) United States Patent
Robinson

(10) Patent No.: US 12,658,679 B2
(45) Date of Patent: Jun. 16, 2026

(54) REPLACEMENT PANELS FOR ELECTRICAL DISTRIBUTION CABINETS FOR THE MONITORING OF TARGETED COMPONENTS AND CONNECTIONS

(71) Applicant: IRISS Holdings, Inc., Bradenton, FL (US)

(72) Inventor: Martin Robinson, Bradenton, FL (US)

(73) Assignee: IRISS Holdings, Inc., Bradenton, FL (US)

( * ) Notice: Subject to any disclaimer, the term of this patent is extended or adjusted under 35 U.S.C. 154(b) by 0 days.

(21) Appl. No.: 18/808,808

(22) Filed: Aug. 19, 2024

(65) Prior Publication Data

US 2024/0413617 A1 Dec. 12, 2024

Related U.S. Application Data

(63) Continuation of application No. 18/233,720, filed on Aug. 14, 2023, now Pat. No. 12,068,587, which is a
(Continued)

(51) Int. Cl.
*H02B 1/30* (2006.01)
*G06F 1/18* (2026.01)
(Continued)

(52) U.S. Cl.
CPC ............. *H02B 1/306* (2013.01); *G06F 1/181* (2013.01); *G06K 19/07758* (2013.01); *H05K 5/30* (2025.01)

(58) Field of Classification Search
CPC ...... H05B 47/19; H05B 45/37; H05B 47/105; H05B 47/16; H05B 45/10; H05B 45/00;
(Continued)

(56) References Cited

U.S. PATENT DOCUMENTS

| | | | |
|---|---|---|---|
| 1,642,698 | A | 9/1927 | Rohn |
| 3,404,316 | A | 10/1968 | Jacobs |

(Continued)

FOREIGN PATENT DOCUMENTS

| | | |
|---|---|---|
| CN | 201213200 | 3/2009 |
| CN | 202171504 | 3/2012 |

(Continued)

OTHER PUBLICATIONS

D.G. Watters et al., Design and Performance of Wireless Sensors For Structural Health Monitoring, Menlo Park, CA, Aug. 18, 2003.
(Continued)

*Primary Examiner* — Adam B Dravininkas
(74) *Attorney, Agent, or Firm* — Akerman LLP

(57) ABSTRACT

Embodiments of the presently disclosed invention may enable electrical components and connections to be monitored within electrical distribution equipment cabinets having a blanking panel. Such an IR/UV-permitting panel may replace the pre-existing blanking panel in order to monitor the adjacent area having the targeted components and connections to be monitored. NFC tags may be utilized in connection with an IR/UV-permitting panel to enable data acquisition and management systems for the monitoring of electrical components in a cabinet.

18 Claims, 11 Drawing Sheets

Related U.S. Application Data continuation of application No. 17/866,909, filed on Jul. 18, 2022, now Pat. No. 11,728,627, which is a continuation of application No. 16/066,271, filed as application No. PCT/US2017/012461 on Jan. 6, 2017, now Pat. No. 11,394,180.

(60) Provisional application No. 62/276,480, filed on Jan. 8, 2016.

(51) Int. Cl.
   *G06K 19/077*       (2006.01)
   *H05K 5/30*         (2025.01)

(58) Field of Classification Search
   CPC ......... H05B 45/20; G06K 2009/00738; G06K 19/07758; H02B 1/056; H02B 1/06; H02B 1/14; H02B 2001/0155; H02B 1/306; H02B 11/127; H02B 1/03; H02B 11/10; H02B 11/02; G06F 1/189; G06F 1/188; G06F 1/181
   See application file for complete search history.

(56)                References Cited

U.S. PATENT DOCUMENTS

| | | | |
|---|---|---|---|
| 6,247,353 | B1 | 6/2001 | Battenberg |
| 6,547,348 | B2 | 4/2003 | Craft |
| 6,616,005 | B1 | 9/2003 | Pereira |
| 6,758,353 | B2 | 7/2004 | Orr |
| 6,798,587 | B2 | 9/2004 | Irani |
| 7,079,334 | B2 | 7/2006 | Holliday |
| 7,209,042 | B2 | 4/2007 | Martin |
| 7,295,133 | B1 | 11/2007 | McCollough, Jr. |
| 7,336,153 | B2 | 2/2008 | Malone |
| 7,432,818 | B2 | 10/2008 | Ray |
| 8,023,818 | B2 | 9/2011 | Schmidt |
| 8,052,231 | B2 | 11/2011 | Rasmussen |
| 8,164,827 | B2 | 4/2012 | Robinson |
| 8,258,928 | B2 | 9/2012 | Tseng |
| 8,400,708 | B2 | 3/2013 | Robinson |
| 8,407,938 | B2 | 4/2013 | Faria |
| 8,421,629 | B2 | 4/2013 | Carr |
| 8,500,271 | B2 | 8/2013 | Howell |
| 8,931,952 | B2 | 1/2015 | Langdoc |
| D727,326 | S | 4/2015 | Sullivan |
| 9,032,211 | B2 | 5/2015 | Arunan |
| 9,044,832 | B2 | 6/2015 | Sullivan |
| 9,154,712 | B2 | 10/2015 | Holliday |
| 9,512,667 | B2 * | 12/2016 | Rowland .................. E06B 5/10 |
| 11,394,180 | B2 | 7/2022 | Robinson |
| 11,480,600 | B2 | 10/2022 | Robinson |
| 11,728,627 | B2 | 8/2023 | Robinson |
| 12,068,587 | B2 | 8/2024 | Robinson |
| 2002/0153338 | A1 | 10/2002 | Orr |
| 2003/0020027 | A1 | 1/2003 | Danvers |
| 2004/0120109 | A1 | 6/2004 | Kennedy |
| 2006/0141921 | A1 | 6/2006 | Turek |
| 2009/0178991 | A1 | 7/2009 | Rasmussen |
| 2010/0000953 | A1 | 1/2010 | Shew |
| 2010/0014152 | A1 | 1/2010 | Robinson |
| 2010/0020389 | A1 | 1/2010 | Schmidt |
| 2010/0107496 | A1 * | 5/2010 | Faria ..................... G02B 7/006 49/149 |
| 2010/0201230 | A1 | 8/2010 | Schweitzer, III |
| 2011/0073726 | A1 | 3/2011 | Bergesch |
| 2011/0083824 | A1 | 4/2011 | Rogers |
| 2011/0158653 | A1 | 6/2011 | Mazed |
| 2012/0049706 | A1 | 3/2012 | Cottuli |
| 2012/0075070 | A1 | 3/2012 | Rai |
| 2012/0091090 | A1 | 4/2012 | Larsen |
| 2013/0117995 | A1 | 5/2013 | Sullivan |
| 2013/0176678 | A1 | 7/2013 | Campbell |
| 2014/0144858 | A1 | 5/2014 | Yokosawa |
| 2014/0160686 | A1 | 6/2014 | Benson |
| 2014/0170971 | A1 * | 6/2014 | Walsh ................ G06K 7/10722 235/462.11 |
| 2014/0218817 | A1 | 8/2014 | Gunell |
| 2015/0060382 | A1 | 3/2015 | Drewery |
| 2015/0131177 | A1 | 5/2015 | Robinson |
| 2015/0154433 | A1 | 6/2015 | Stewart |
| 2015/0177072 | A1 | 6/2015 | Murphy |
| 2015/0230354 | A1 | 8/2015 | Sullivan |
| 2015/0233999 | A1 | 8/2015 | Stock |
| 2015/0334355 | A1 | 11/2015 | Ware |

FOREIGN PATENT DOCUMENTS

| | | |
|---|---|---|
| CN | 202856180 | 4/2013 |
| CN | 203800406 | 8/2014 |
| CN | 204088925 | 1/2015 |
| CN | 204651701 | 9/2015 |
| WO | 2012037575 | 3/2012 |
| WO | 2013021182 | 2/2013 |
| WO | 2015057504 | 4/2015 |
| WO | 2015065376 | 5/2015 |

OTHER PUBLICATIONS

Fluke CV401 ClirVu® 95 mm (4 in) Infrared Window, http://en-us.fluke.com/products/ir-windows/fluke-cv401.html, retrieved Nov. 3, 2015.
Startech, Vented Blank Panel with Hinge for Server Racks—6U, https://www.startech.com/en-us/server-management/rkpnlhv6u, retrieved Nov. 4, 2015.
Startech, Vented Blank Panel for Server Racks—1U, https://www.startech.com/en-us/server-managementirkpnltl1uv, retrieved Nov. 4, 2015.
International Search Report and Written Opinion for Application No. PCT/US18/29050 dated Aug. 3, 2018.
International Search Report and Written Opinion for Application No. PCT/US2017/012461, Mar. 17, 2017.

* cited by examiner

1

1

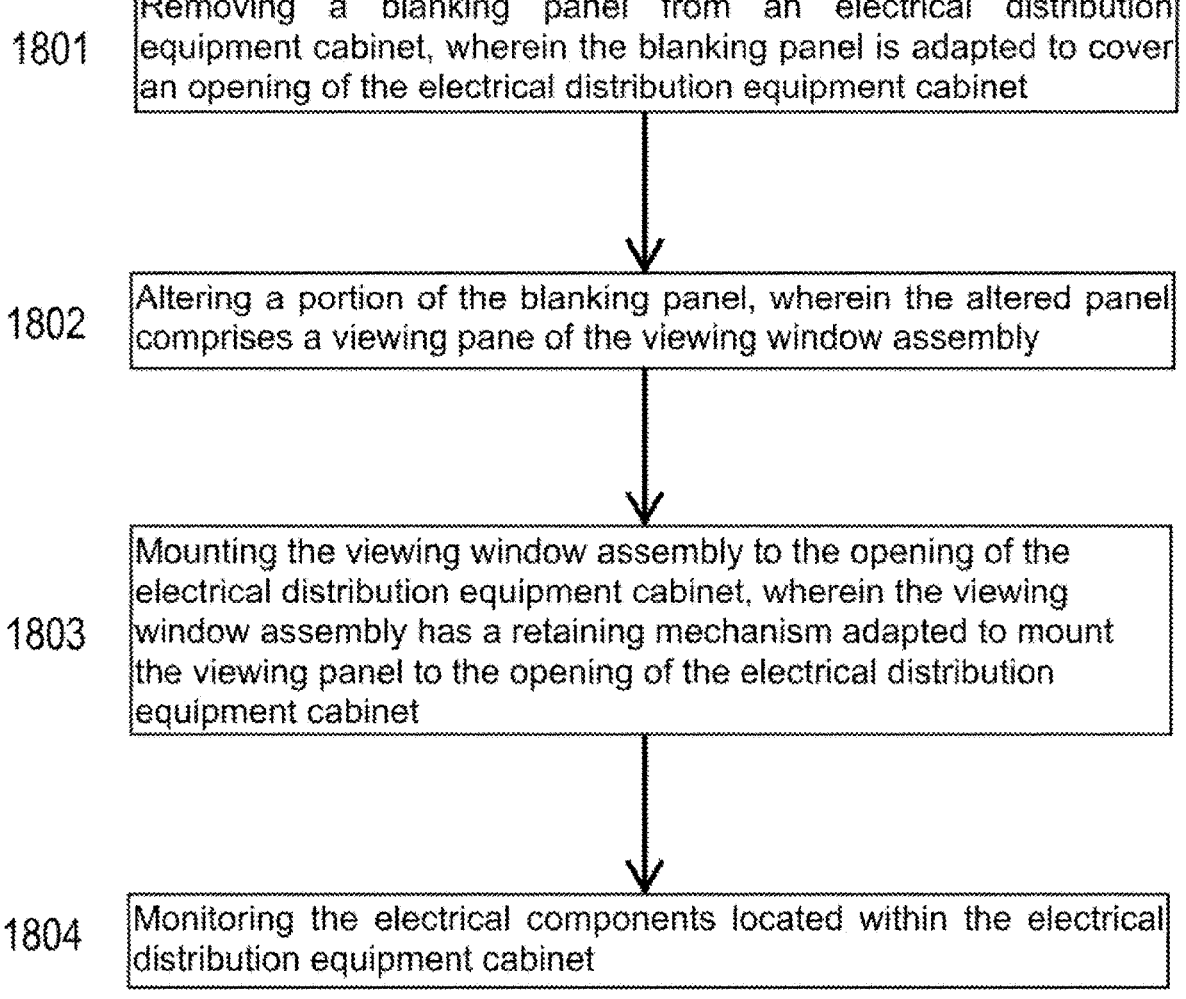

1801 — Removing a blanking panel from an electrical distribution equipment cabinet, wherein the blanking panel is adapted to cover an opening of the electrical distribution equipment cabinet 1802 — Altering a portion of the blanking panel, wherein the altered panel comprises a viewing pane of the viewing window assembly 1803 — Mounting the viewing window assembly to the opening of the electrical distribution equipment cabinet, wherein the viewing window assembly has a retaining mechanism adapted to mount the viewing panel to the opening of the electrical distribution equipment cabinet 1804 — Monitoring the electrical components located within the electrical distribution equipment cabinet

Figure 18

REPLACEMENT PANELS FOR ELECTRICAL DISTRIBUTION CABINETS FOR THE MONITORING OF TARGETED COMPONENTS AND CONNECTIONS

CROSS-REFERENCE TO RELATED APPLICATIONS

This application is a continuation of U.S. patent application Ser. No. 18/233,720, filed Aug. 14, 2023, which is a continuation of U.S. patent application Ser. No. 17/866,909, filed Jul. 18, 2022, which issued as U.S. Pat. No. 11,728,627, which is a continuation of U.S. patent application Ser. No. 16/066,271, filed Jun. 26, 2018, which issued as U.S. Pat. No. 11,394,180, which is a ¶371 national phase entry of PCT/US2017/012461, filed Jan. 6, 2017, which claims priority to U.S. Provisional Patent Application No. 62/276,480, filed Jan. 8, 2016, all of which are incorporated by reference herein in their entirety. This application includes material which is subject to copyright protection. The copyright owner has no objection to the facsimile reproduction by anyone of the patent disclosure, as it appears in the Patent and Trademark Office files or records, but otherwise reserves all copyright rights whatsoever.

FIELD OF THE INVENTION

The presently disclosed invention relates in general to the field of cabinets for electrical distribution equipment, and in particular to: an IR/UV-permitting panel for replacing filler or blanking plates for cabinets that enclose electrical components of power distribution systems; data acquisition and management systems and devices utilizing NFC tags for the monitoring of electrical components in electrical distribution equipment cabinets; and, methods for monitoring electrical components and connections located within targeted areas in electrical distribution equipment cabinets via IR/UV-permitting panels and NFC tags.

BACKGROUND

Basic cabinet-based power systems, power distribution panelboards, circuit breaker panels, switchboards, and blanking panels for equipment racks are known in the art. Technology for such electrical equipment and components has been described in the following U.S. patents and publications: U.S. Pat. No. 1,642,698; No. 2014/0144858; U.S. Pat. No. 6,758,353; No. 2014/0160686; U.S. Pat. Nos. 3,404,316; 6,547,348; and 8,052,231. These patents and publications are incorporated herein by reference.

One drawback with certain implementations of monitoring electrical components is the limited accessibility of components' electrical connections within a cabinet. Due to the location of electrical connections within a housing, a proper inspection may not be physically possible. For example, an infrared camera may not be able to capture accurate temperature measurements if the targeted connection is obstructed by other electrical or structural components.

Further, modification of preexisting cabinets may not be feasible or practical. Certain power distribution systems may not be readily altered due to safety concerns in light of the high voltage of the power source. Only competent technicians with specialized training may be permitted to access electrical equipment within power cabinets. In some circumstances, it may not be acceptable to power-off systems due to unwanted interruptions to downstream equipment. Financial concerns may also prevent the upgrading or enhancement of power systems via customized installations of viewing window assemblies and/or the rearrangement of inaccessible electrical connections. Rather than replacing or modifying entire racks or cabinets, embodiments of the presently disclosed invention, inter alia, addresses the problem of monitoring electrical components in cabinets without altering the structure of the cabinets.

SUMMARY OF THE INVENTION

Embodiments of the presently disclosed invention may enable electrical components and connections to be monitored within an enclosure via a panel that is transparent to at least one of infrared (IR) radiation, ultraviolet (UV) radiation, or visible light. Such an IR/UV-permitting panel may be located adjacent to the targeted area, which may be within close proximity to the monitored electrical components/connections. The IR/UV-permitting panel may be interchangeable with filler or blanking panels that are located adjacent to the targeted area. In certain embodiments, a preexisting blanking panel may be altered or adapted to include an IR/UV-permitting viewing window assembly.

Some embodiments of the presently disclosed invention may include NFC tags. The NFC tags may enable data acquisition and management systems for the monitoring of electrical components in electrical distribution equipment cabinets. Such NFC tags may be utilized in connection with IR/UV-permitting panels. The NFC tags may receive, store and transmit information concerning the electrical components in electrical distribution equipment cabinets, such as the components' specifications, temperature operating ranges, maintenance history, the last time that they were checked, and additional data concerning the infrared and visual inspection of the components/connections.

In an embodiment, a viewing window assembly may comprise a viewing panel that may be adapted to permit the monitoring of electrical components located within an electrical distribution equipment cabinet. The viewing window assembly may further comprise a retaining mechanism that may be adapted to mount the viewing panel to an opening of the electrical distribution equipment cabinet. The opening may be adapted for a removable blanking panel. The viewing window assembly may have the same dimensions as the removable blanking panel. In certain embodiments, the viewing panel may be transparent to infrared radiation. In some embodiments, the viewing panel may be transparent to ultraviolet radiation. The viewing panel may be transparent to visible light. The retaining mechanism may comprise a tool-less mounting mechanism, such a latch, clip, notch, slot, or snap. The retaining mechanism for the viewing window assembly may be based on a retaining mechanism for the removable blanking panel.

In certain embodiments, the viewing window assembly may further comprise a Near Field Communication (NFC) tag that may be adapted to permit the monitoring of the electrical components located within the electrical distribution equipment cabinet. The NFC tag may be mounted to the viewing panel. The NFC tag may be adapted to receive, store and transmit information related to the electrical components in the electrical distribution equipment cabinet. The information may include specification information for the electrical components, temperature operating-range information for the electrical components, maintenance information for the electrical components, repair information for the electrical components, access log information for the electrical components, infrared-inspection information for the electrical components, or visual-inspection information for the electrical components.

In an embodiment of a method for the monitoring of electrical components in electrical distribution equipment cabinets, the method may comprise removing a blanking panel from the electrical distribution equipment cabinet. The blanking panel may be adapted to cover an opening of the electrical distribution equipment cabinet. The method may also comprise mounting a viewing window assembly to the opening of the electrical distribution equipment cabinet. The viewing window assembly may comprise a viewing panel that is adapted to permit the monitoring of the electrical components located within the electrical distribution equipment cabinet. The viewing window assembly may further comprise a retaining mechanism that is adapted to mount the viewing panel to the opening of the electrical distribution equipment cabinet. The method may further comprise monitoring, via a detection device, the electrical components located within the electrical distribution equipment cabinet. The detection device may be an infrared camera. In some embodiments, the detection device may be an ultraviolet camera. In certain embodiments, the method may comprise altering a portion of the blanking panel. The altered panel may comprise a viewing pane, and the viewing panel may comprise the viewing pane. In an embodiment, the viewing panel may comprise a polymeric material that is transparent to infrared radiation. The viewing panel may comprise a polymeric material that is transparent to ultraviolet radiation.

BRIEF DESCRIPTIONS OF THE DRAWINGS

The foregoing and other objects, features, and advantages of the invention will be apparent from the following more particular description of embodiments as illustrated in the accompanying drawings, in which reference characters refer to the same parts throughout the various views. The drawings are not necessarily to scale, emphasis instead being placed upon illustrating principles of the invention.

Figure 1:
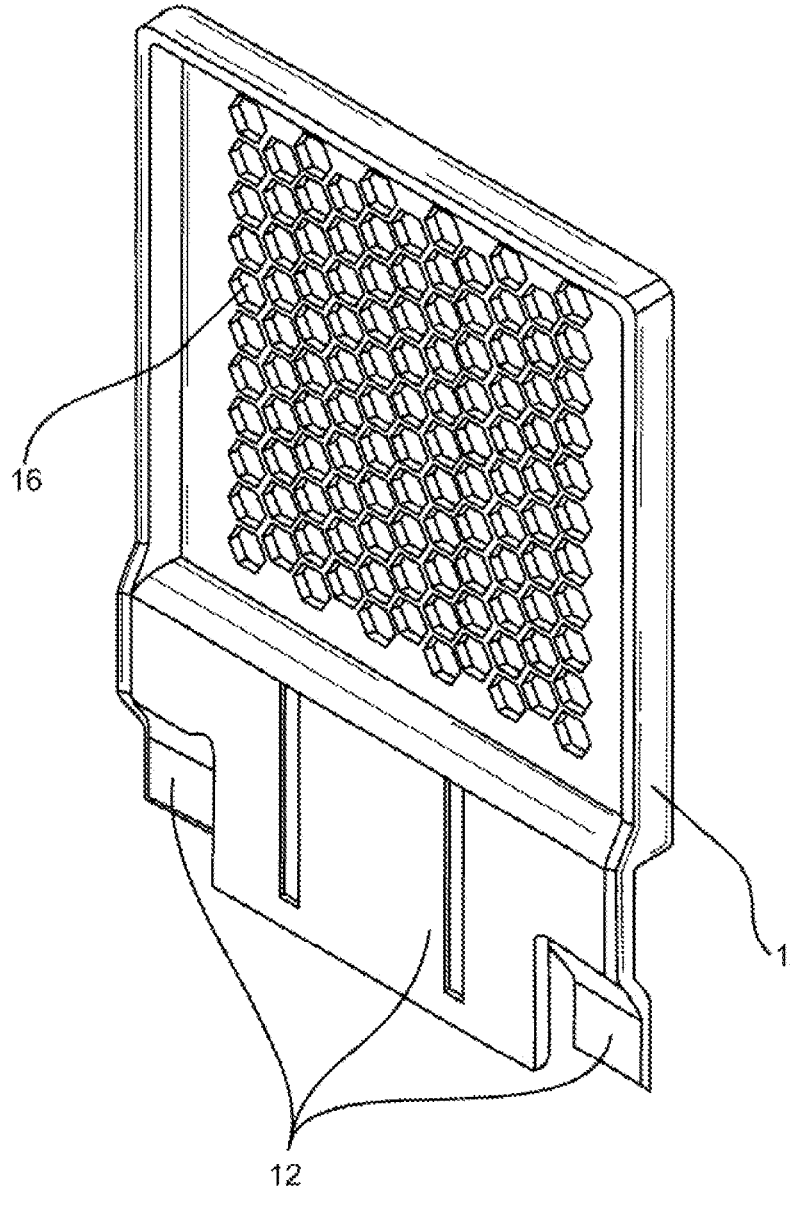
FIG. 1 is a diagram illustrating a perspective view of an IR/UV-permitting panel having multiple rows of ports, in accordance with certain embodiments of the invention.
Figure 2:
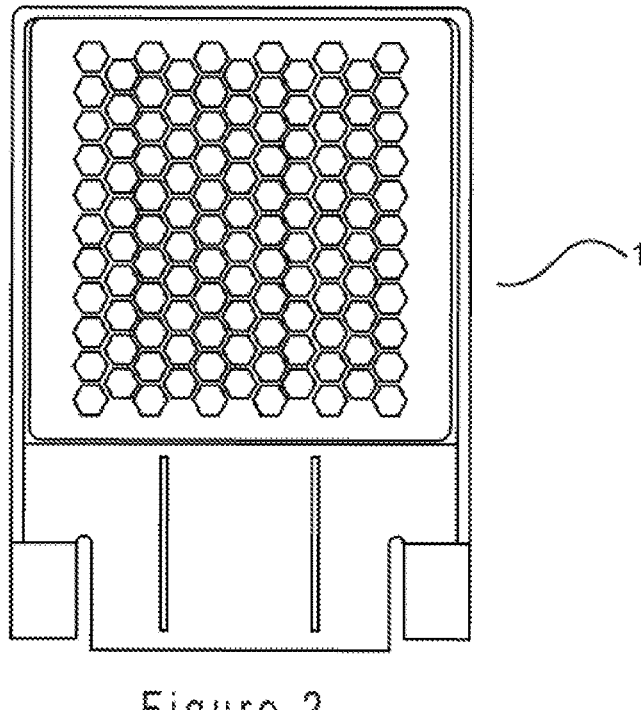
FIG. 2 is a diagram illustrating a rear view of an IR/UV-permitting panel having multiple rows of ports, in accordance with certain embodiments of the invention.
Figure 3:
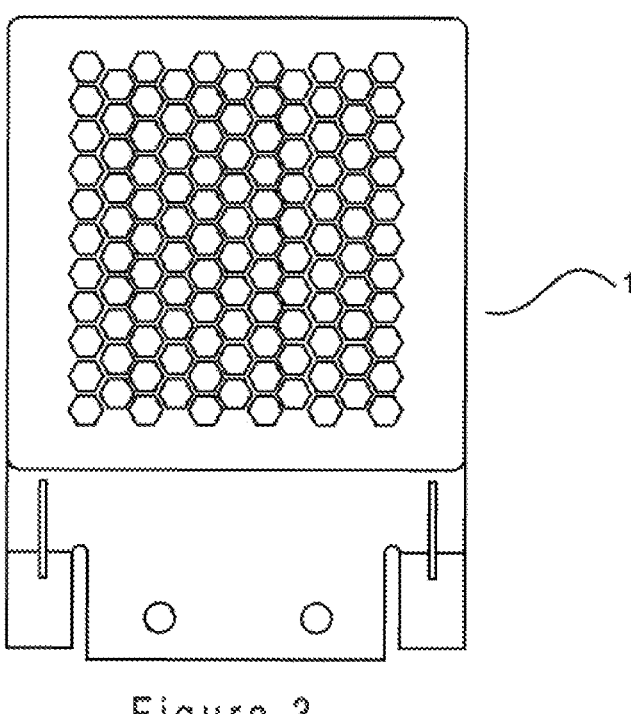
FIG. 3 is a diagram illustrating a front view of an IR/UV-permitting panel having multiple rows of ports, in accordance with certain embodiments of the invention.
Figure 4:
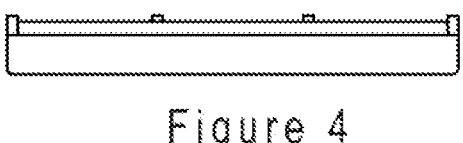
FIG. 4 is a diagram illustrating a top view of an IR/UV-permitting panel having multiple rows of ports, in accordance with certain embodiments of the invention.
Figure 5:
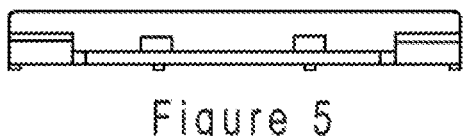
FIG. 5 is a diagram illustrating a bottom view of an IR/UV-permitting panel having multiple rows of ports, in accordance with certain embodiments of the invention.
Figure 6:
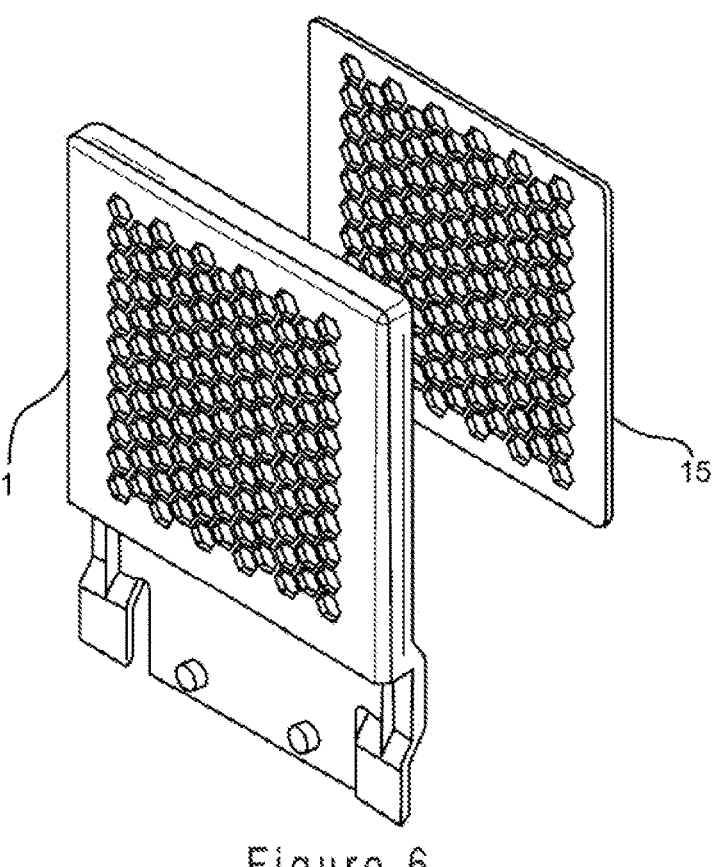
FIG. 6 is a diagram illustrating an exploded view of the front side of an IR/UV-permitting panel displaying a second grill, in accordance with certain embodiments of the invention.
Figures 7A, 7B:
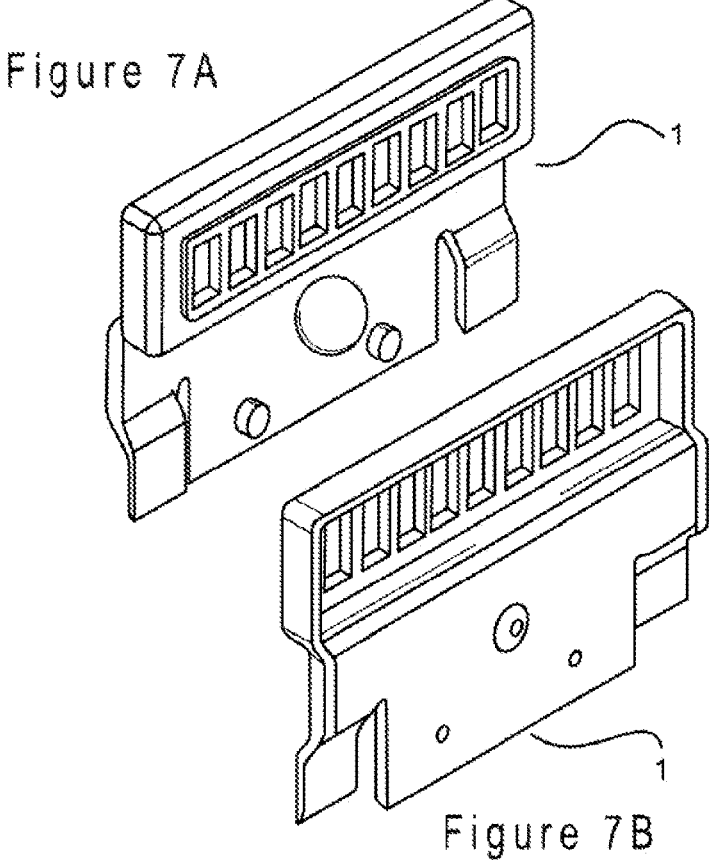
FIGS. 7A and 7B are diagrams illustrating perspective views of an IR/UV-permitting panel having one row of ports, in accordance with certain embodiments of the invention.
Figure 8:
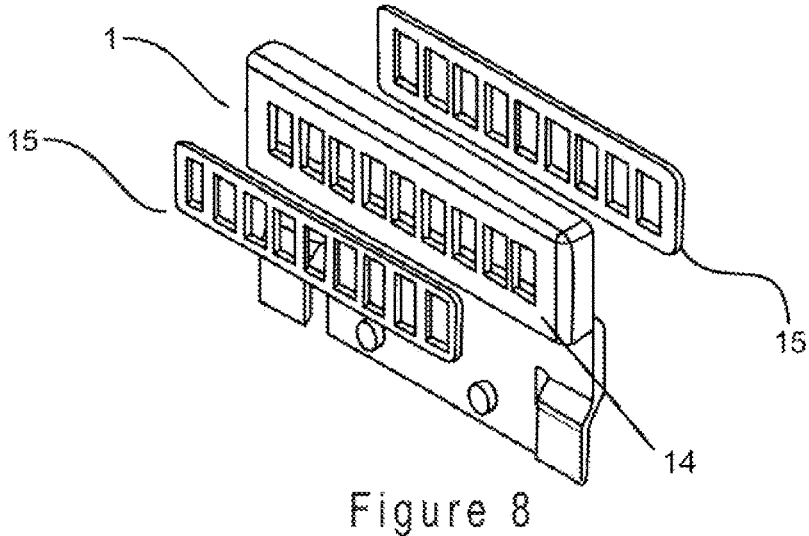
FIG. 8 is a diagram illustrating an exploded view of an IR/UV-permitting panel having one row of ports displaying a first grill and a second grill, in accordance with certain embodiments of the invention.
Figure 9:
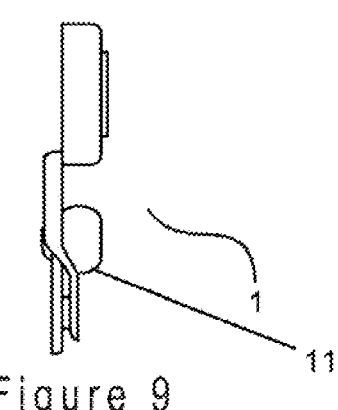
FIG. 9 is a diagram illustrating a side view of an IR/UV-permitting panel having one row of ports, in accordance with certain embodiments of the invention.
Figure 10:
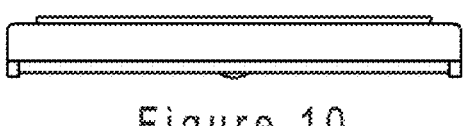
FIG. 10 is a diagram illustrating a top view of an IR/UV-permitting panel having one row of ports, in accordance with certain embodiments of the invention.
Figure 11:
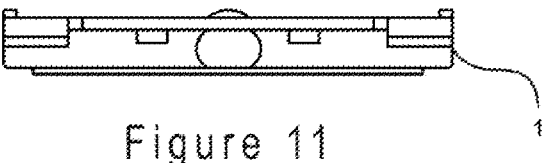
FIG. 11 is a diagram illustrating a bottom view of an IR/UV-permitting panel having one row of ports, in accordance with certain embodiments of the invention.
Figure 12:
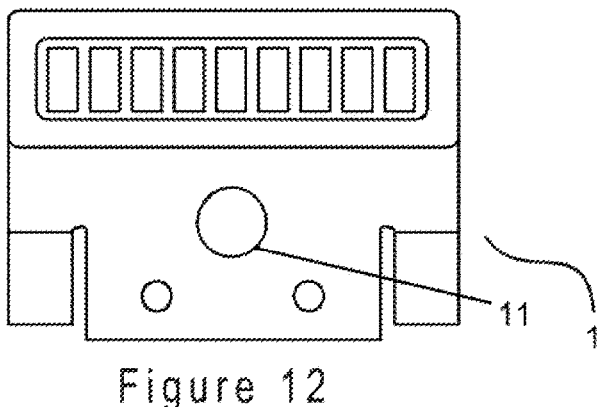
FIG. 12 is a diagram illustrating a front view of an IR/UV-permitting panel having one row of ports, in accordance with certain embodiments of the invention.
Figure 17:
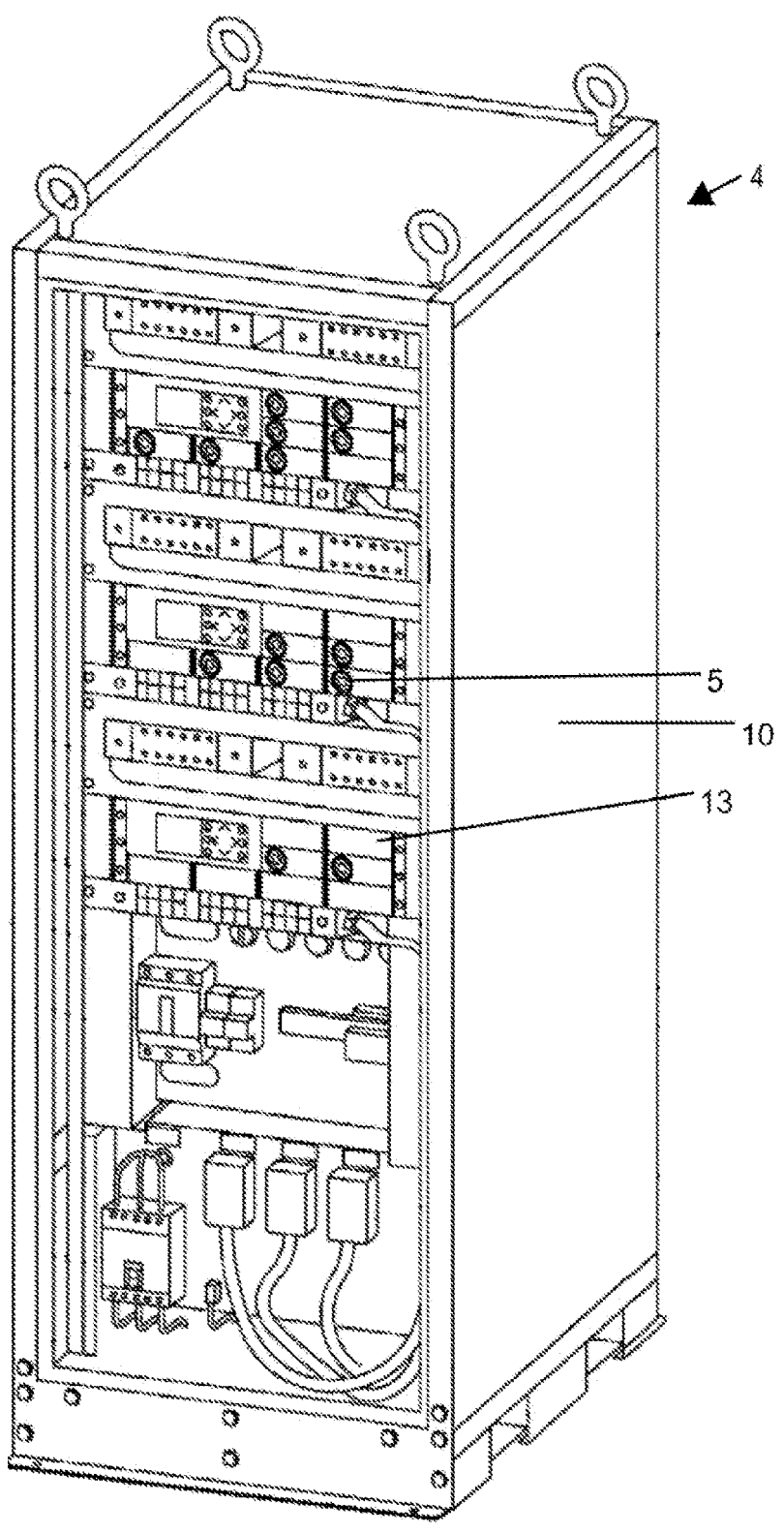

FIG. 17 is a perspective view of a power cabinet, as depicted in FIG. 2 of U.S. Patent Publication No. US 2014/0160686 that was previously incorporated by reference above.

FIG. 18 is a flow chart illustrating steps of a method for the monitoring of electrical components within an electrical distribution equipment cabinet, in accordance with certain embodiments of the invention.

DETAILED DESCRIPTION

Reference will now be made in detail to the embodiments of the presently disclosed invention, examples of which are illustrated in the accompanying drawings.

The presently disclosed invention may be embodied in various forms, including a device, a system, or a method for monitoring of electrical components in electrical distribution equipment cabinets. The embodiments may allow for the mounting of an IR/UV-permitting panel 1. The panel 1 may be transparent to at least one of infrared (IR) radiation, ultraviolet (UV) radiation, or visible light. In an embodiment, the panel may comprise polymeric material that is opaque but transparent to infrared radiation or ultraviolet radiation. Embodiments may comprise an IR/UV-permitting viewing window assembly or device 2, for replacing a filler or blanking panel 3 for cabinets 4 that enclose electrical components/equipment 5 of power distribution systems 6. An IR/UV-permitting viewing window assembly 2 may comprise an IR/UV-permitting panel 1. A benefit may include the inspection of electrical components 5, such as circuit breakers 7, which may be located in the proximity of the replaced blanking panel 3. The circuit breakers 7, and/or its connection 8 to other electrical components 5 located within a power cabinet 4, may not be readily accessible for inspection. The removal of a solid blanking panel 3 would permit access to a targeted area 9, which may include a circuit breaker 7 and/or its electrical connection 8. It may be extremely hazardous to permit uncontrolled or unauthorized access to the circuit breaker's connection 8 and other electrical components 5 located within a power cabinet 4. A blanking panel 3 for power cabinets 4 may be intended to isolate the electrical components 5 from the ambient environment for the protection of the electrical components 5 and for general safety considerations, which may include those regulated by Occupational Safety and Health Administration (OSHA).

For some embodiments, an advantage of the presently disclosed invention may include the limited inspection of a known targeted area 9 that does not require the removal of an entire side of the housing 10 of a cabinet 4. Rather than alter the housing 10, a blanking panel 3 located in the proximity of the targeted area 9 may be removed to gain access to the electrical components 5 equipment for the purpose of infrared inspections or temperature measurement. It is known that infrared/ultraviolet cameras or detection devices 11 may be used to monitor electrical components 5 for observing their installation and operation.

In some embodiments, an IR/UV-permitting viewing window assembly 2 may comprise an IR/UV-permitting panel 1 and a retaining mechanism 12. Embodiments of an IR/UV-permitting viewing window assembly 2 may have the same shape and dimensions as the replaced blanking panel 3. The retaining mechanism 12 for the IR/UV-permitting panel 1 may also emulate the retaining mechanism 12 of the replaced blanking panel 3. In certain embodiments, the retaining mechanism 12 may comprise any means for mounting a panel 1 to a rack or housing 10 of a cabinet 4. The retaining mechanism 12 may permit tool-less mounting so that the blanking plate 3 may be removed, and the IR/UV-permitting panel 1 may be mounted, by hand without the use of any tools. For example, the retaining mechanism 12 may comprise a latch, clip, notch, slot, snap or any other means for securing covering such as a panel, whether by fastening, turning, twisting, pushing, pulling, pinching, sliding, leaning, leveraging, or pressing. Alternatively, the retaining mechanism 12 may comprise an adhesive or screws. Such adhesive or screws of the replaced blanking panel 3 may be removed before mounting the IR/UV-permitting panel 1. An adhesive or screws may be used to retain the IR/UV-permitting panel 1.

In certain embodiments, a viewing window assembly 2 may be mounted within an aperture 13 created in a removed blanking panel 3. The assembly 2 may be supported directly within the aperture 13 by the cabinet 4. In the alternative, the viewing window assembly 2 may be supported in a frame (not shown) adapted to the aperture 13. In some embodiments, the viewing window assembly 2 may comprise a viewing pane 14 that may be mounted to the frame. In certain embodiments, the removed blanking panel 3 may be altered by eliminating a solid portion of the panel 3 and mounting the viewing pane 14 directly to the panel 3. In an embodiment, holes may be drilled into the solid portion of the panel 3 in order to make a viewing pane 14. The altered or modified panel 3 may be mounted or reinserted over the aperture 13. The viewing pane 14 may be formed from an infrared and/or ultraviolet transmitting material. The pane 14 may have two generally opposed surfaces. In addition, the viewing window assembly 2 may comprise a protective grill 15 lying against one of the opposed surfaces and providing mechanical protection and support to the pane. The grill 15 may have an array of holes or ports 16 formed therethrough that permit infrared inspection through the pane 14 from the outside of the housing 10 of the cabinet 4 when the modified blanking panel 3 is reinserted.

In certain embodiments, a protective grill 15 is not included. When the modified blanking panel 3 is reinserted, one of the opposed surfaces of the pane 14 may be located toward the interior of the housing 10, and the other surface may be located toward the exterior of the housing 10. The protective grill 15 may be provided on either of those opposed faces depending on the conditions inside and outside the housing 10. In some embodiments, a second grill 15 may be included on the other surface of the pane 14, so that the pane 14 is equipped to resist adverse conditions that prevail in the interior and the exterior of the housing 10. Alignment means may be provided on the first and second grills 15 so that the ports 16 of the first grill 15 align with the ports 16 of the second grill 15. This may take various forms, including a notch formed in identical places on the periphery of the first and second grills 15 that engage a protuberance provided on the panel 3 or frame, if present. Alternatively, the first and second grills 15 could be provided with complementary formations arranged to ensure the ports 16 align when the formations co-operate with one another.

In some embodiments, an arrangement the ports 16 may be all of an equal size and shape. In certain embodiments, each hole or port 16 may be a regular polygon in shape with sides of equal length. An array of ports 16 of such a shape may be uniform in appearance and in infrared transmissivity. The characteristics of the grill(s) 15, such as the shape of the ports 16, the dimensions of the ports 16, and the spacing between the ports 16, may be important in certain applications because they are related to the strength of the assembly and the transmission of electromagnetic radiation therethrough. Thus, there may be an optimum size port 16 and size spacing depending on the application of the viewing window assembly 2 because some applications may require extra strength and others extra transmission quality. To achieve the optimum strength and transmission, however, all of the ports 16 may be the same size and shape, in accordance with some embodiments.

In certain embodiments, the ports 16 are a shape that tessellate, such that two adjacent ports 16 are spaced apart by a narrow strip. This arrangement enables all strips between adjacent ports 16 to have a uniform thickness which provides uniformity in strength and transmission over the entire array. The ports 16 could be a combination of different shapes that tessellate, for example octagons and squares, or may be similar tessellating shapes such as hexagons, squares or triangles. In some embodiments, all of the ports 16 may be hexagonal because this may provide a good balance between strength and transmission, regardless of the orientation of an infrared imaging camera 11.

Figure 13:
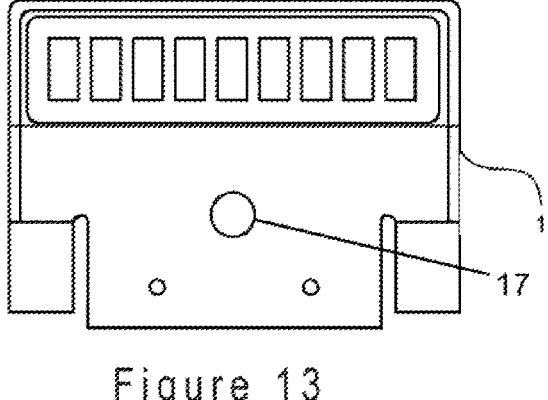
FIG. 13 is a diagram illustrating a rear view of an IR/UV-permitting panel having one row of ports, in accordance with certain embodiments of the invention.
Figure 14:
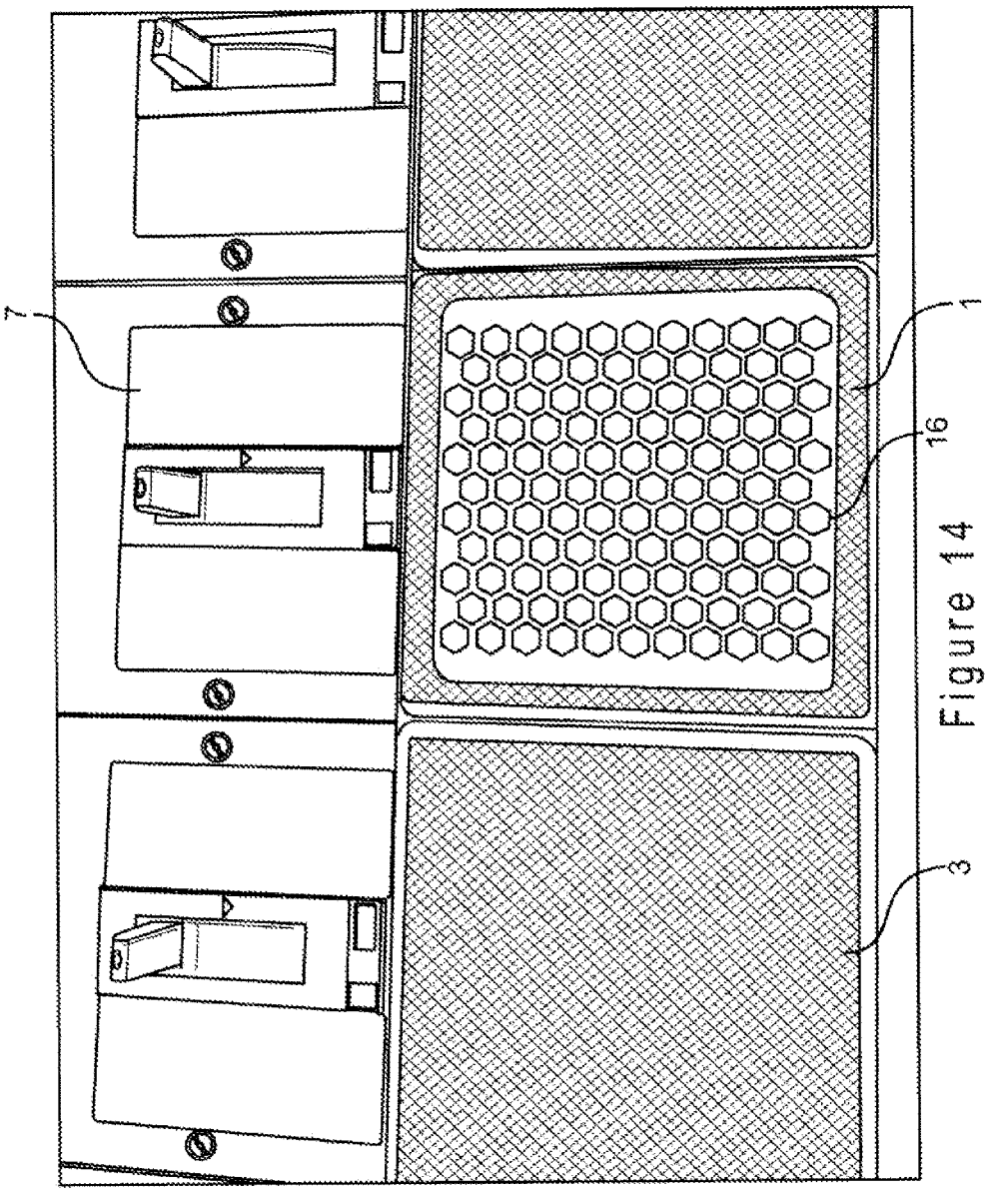
FIGS. 14 and 15 are diagrams illustrating an IR/UV-permitting panel adjacent to circuit breakers and blanking panels, in accordance with certain embodiments of the invention.
Figure 15:
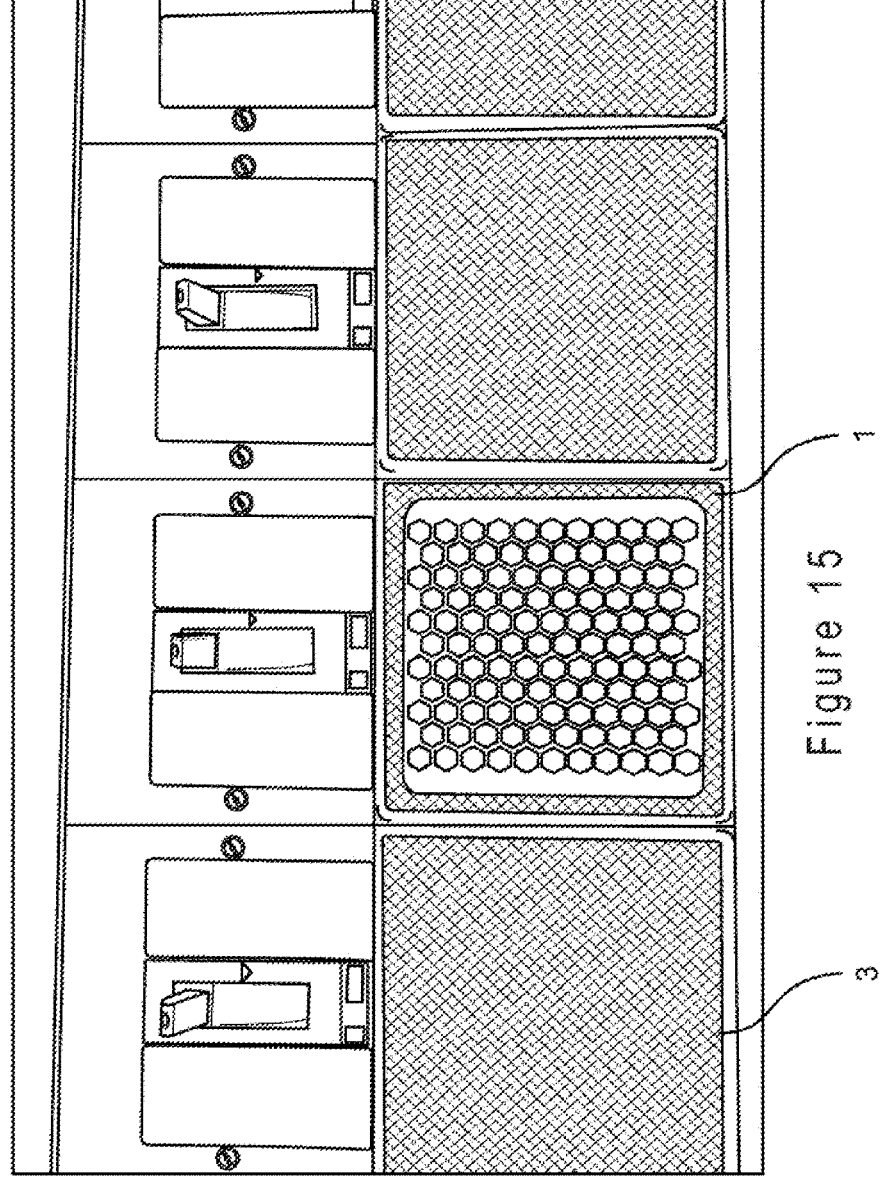
Figure 16:
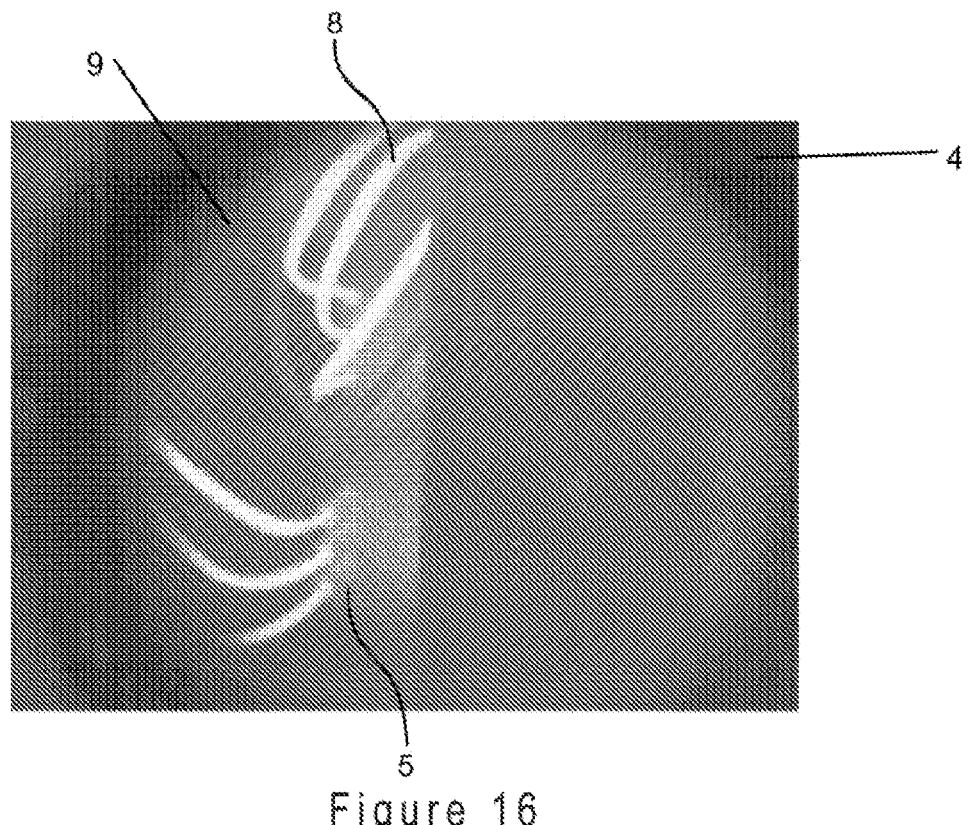
FIG. 16 is an infrared image illustrating temperature measurements via an IR/UV-permitting panel adjacent to electrical components and their connections within a targeted area of a power cabinet, in accordance with certain embodiments of the invention.

FIGS. 1-6 illustrate various views of an embodiment of an IR/UV-permitting panel 1 having multiple rows of ports 16. FIGS. 7-13 illustrate various views of an embodiment of an IR/UV-permitting panel 1 having one row of ports 16. FIGS. 14-15 are diagrams illustrating an IR/UV-permitting panel 1 adjacent to circuit breakers 7 and blanking panels 3. FIG. 16 is an infrared image illustrating temperature measurements via an IR/UV-permitting panel 1. As can be appreciated from this image, the IR/UV-permitting panel 1 allows the transmission of the electromagnetic spectral range of the radiation dispensed from the adjacent electrical components 5 and their connections 8 within a targeted area 9 of a cabinet 4 to pass through the panel 1 so that the radiation can be imaged or otherwise monitored by an appropriate camera or detection device 11. Such a device 11 may enable the identification of specific areas of the electrical equipment or components 5 that are failing or that are achieving temperatures that are hotter or cooler than their specified operating range. Such a monitoring process allows the inspector of such electrical equipment and components 5 to readily identify and resolve any potential problems before they occur, as well as to troubleshoot any existing problems.

The pane 14 may be made of a material which enables electromagnetic radiation in the infrared and/or ultraviolet range to pass therethrough. In an embodiment, the pane 14 is made from an infrared and/or ultraviolet transmitting polymer which is not water soluble. In some embodiments, the material from which the pane 14 is made is an infrared and/or ultraviolet transmitting crystal such as calcium fluoride ($CaF_2$). In certain embodiments, it is critical that the material be non-flammable. Additionally, the size of ports 16 may be a critical feature in accordance with some embodiments. For example, the ports 16 may need to be small enough to retard the propagation of fire and impede the passage of fingers due to safety concerns while still permitting the infrared inspection through the pane 14.

The grill 15 may be made from any one material or combination of materials that exhibit sufficient structural strength to provide sufficient mechanical protection and support to the pane 14. The framework of each grill 15 may be made of aluminum or other nonferrous metals. Such a framework may be coated with plastics.

Certain IR/UV-permitting viewing window assemblies 2 for monitoring general or large areas within electrical distribution equipment cabinets 4 are described by the present inventor in the following patent and publications: U.S. Pat. No. 8,164,827; No. 2010/0014152; and, No. 2015/0131177. These patents and publications are incorporated herein by reference. In certain embodiments of the presently disclosed invention, the IR/UV-permitting panel 1 for monitoring electrical components/equipment 5 and/or their connections 8 within a targeted area 9 of a cabinet 4 may be expandable to fit openings of various sizes in the cabinet 4. For example, one portion of an IR/UV-permitting panel 1 may be adapted to slide over another portion of the panel 1. Accordingly, such an adjustable panel 1 may replace blanking panels 3 of varying sizes and dimensions. In some embodiments, a IR/UV-permitting panel 1 may be adapted to be expandable to two predetermined lengths for installations that have two types of blanking panels 3 that correspond to two types of circuit breakers 5 for certain power cabinets 4. In certain embodiments, a substantial portion of an IR/UV-permitting panel 1 may be formed of IR/UV-permitting materials.

In some embodiments, an objective of the presently disclosed device, system and method may be the enablement of data acquisition and management systems for the monitoring of electrical components 5 in electrical distribution equipment cabinets 4. Technology for apparatus and methods for monitoring electrical interconnections using radio-frequency identification (RFID) devices have been described in WIPO Patent Publication No. WO 2015/057504, which published on Apr. 23, 2015. Near field communication (NFC) technology, such as an NFC tag, has been described in U.S. Pat. No. 9,032,211. These patents and publications are incorporated herein by reference. In some embodiments, NFC technology may be utilized to enable communication between the electrical components 5 with monitoring devices, such as an appropriate camera or detection device 11. In certain embodiments, a NFC tag 17 may be utilized in connection with a panel 1 or an IR/UV-permitting viewing window assembly 2. The NFC tags 17 may be programmed with information concerning the electrical components 5 in electrical distribution equipment cabinets 4, such as the specifications of the components 5, temperature operating ranges, maintenance history, the last time that the components 5 were checked, and additional data concerning the infrared and visual inspection of the components/connections 5. In some embodiments, as illustrated in FIG. 13, the NFC tag 17 may be mounted on the inside of the IR/UV-permitting panel 1 in order to prevent tampering and contamination. The NFC tag 17 may be embedded within the IR/UV-permitting panel 1 in accordance with certain embodiments of the invention. In certain embodiments, the NFC tag 17 may be located under a label on the plane 1. The NFC tags 17 may be a standalone component, in accordance with certain embodiments.

While the invention has been particularly shown and described with reference to an embodiment thereof, it will be understood by those skilled in the art that various changes in form and details may be made therein without departing from the spirit and scope of the invention. Although some of the drawings illustrate a number of operations in a particular order, operations which are not order-dependent may be reordered and other operations may be combined or broken out. As described herein, FIG. 18 illustrates the steps of a method for the monitoring of electrical components within an electrical distribution equipment cabinet, in accordance with certain embodiments of the invention. These steps may include the following: Removing a blanking panel from an electrical distribution equipment cabinet, wherein the blanking panel is adapted to cover an opening of the electrical distribution equipment cabinet [step 1801]; Altering a portion of the blanking panel, wherein the altered panel comprises a viewing pane of the viewing window assembly [step 1802]; Mounting the viewing window assembly to the opening of the electrical distribution equipment cabinet, wherein the viewing window assembly has a retaining mechanism adapted to mount the viewing panel to the opening of the electrical distribution equipment cabinet [step 1803]; and, Monitoring the electrical components located within the electrical distribution equipment cabinet [step 1804]. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

What is claimed is:

1. A system, comprising:
   a viewing panel configured to permit the monitoring of electrical components located within an electrical distribution equipment cabinet, wherein the viewing panel comprises a first side that faces away from the electrical distribution equipment cabinet when the viewing panel is mounted to an opening of the electrical distribution equipment cabinet, wherein the viewing panel comprises a second side that faces inside the electrical distribution equipment cabinet when the viewing panel is mounted to the opening of the electrical distribution equipment cabinet; and
   a Near Field Communication (NFC) tag configured to receive, store, and transmit information related to the electrical components located within the electrical distribution equipment cabinet, wherein the NFC tag is contained at least partially within the electrical distribution equipment cabinet when the viewing panel is mounted to the opening of the electrical distribution equipment cabinet, wherein the NFC tag is (i) positioned on the second side of the viewing panel, or (ii) embedded in the viewing panel.

2. The system of claim 1, wherein the viewing panel is opaque to visible light.

3. The system of claim 1, wherein the viewing panel is transparent to ultraviolet radiation.

4. The system of claim 1, wherein the viewing panel is transparent to visible light.

5. The system of claim 1, further comprising a retaining mechanism configured to mount the viewing panel to the opening of the electrical distribution equipment cabinet.

6. The system of claim 5, wherein the retaining mechanism comprises an adhesive or screws.

7. The system of claim 1, wherein the viewing panel comprises a polymeric material that is transparent to infrared radiation.

8. The system of claim 1, wherein the viewing panel is at least part of an altered removable blanking panel.

9. The system of claim 1, wherein the information related to the electrical components located within the electrical distribution equipment cabinet is selected from the group consisting of specification information for the electrical components, temperature operating-range information for the electrical components, maintenance information for the electrical components, repair information for the electrical components, access log information for the electrical components, infrared-inspection information for the electrical components, and visual-inspection information for the electrical components.

10. The system of claim 1, wherein the NFC tag is contained entirely within the electrical distribution equipment cabinet when the viewing panel is mounted to the opening of the electrical distribution equipment cabinet.

11. The system of claim 1, wherein the NFC tag is a standalone NFC tag.

12. A method, comprising:

removing a blanking panel from an electrical distribution equipment cabinet, wherein the blanking panel is configured to cover an opening of the electrical distribution equipment cabinet; and mounting a viewing panel to the opening of the electrical distribution equipment cabinet, wherein the viewing panel is configured to permit the monitoring of electrical components located within the electrical distribution equipment cabinet, wherein the viewing panel comprises a first side that faces away from the electrical distribution equipment cabinet when the viewing panel is mounted to the opening of the electrical distribution equipment cabinet, wherein the viewing panel comprises a second side that faces inside the electrical distribution equipment cabinet when the viewing panel is mounted to the opening of the electrical distribution equipment cabinet, wherein a Near Field Communication (NFC) tag is contained at least partially within the electrical distribution equipment cabinet when the viewing panel is mounted to the opening of the electrical distribution equipment cabinet, wherein the NFC tag is configured to receive, store, and transmit information related to the electrical components located within the electrical distribution equipment cabinet, wherein the NFC tag is (i) positioned on the second side of the viewing panel, or (ii) embedded in the viewing panel.

13. The method of claim 12, further comprising monitoring the electrical components located within the electrical distribution equipment cabinet.

14. The method of claim 12, further comprising altering a portion of the blanking panel to include the viewing panel.

15. The method of claim 12, further comprising positioning the NFC tag on the second side of the viewing panel.

16. The method of claim 12, further comprising embedding the NFC tag in the viewing panel.

17. The method of claim 12, wherein the NFC tag is contained entirely within the electrical distribution equipment cabinet when the viewing panel is mounted to the opening of the electrical distribution equipment cabinet.

18. The method of claim 12, wherein the NFC tag is a standalone NFC tag.

* * * * *